(12) United States Patent
Kawanami et al.

(10) Patent No.: US 10,840,070 B2
(45) Date of Patent: Nov. 17, 2020

(54) ION BEAM DEVICE AND CLEANING METHOD FOR GAS FIELD ION SOURCE

(71) Applicant: Hitachi High-Tech Corporation, Tokyo (JP)

(72) Inventors: Yoshimi Kawanami, Tokyo (JP); Atsushi Kobaru, Tokyo (JP); Tomihiro Hashizume, Tokyo (JP); Hiroyasu Shichi, Tokyo (JP); Shinichi Matsubara, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 339 days.

(21) Appl. No.: 15/932,307

(22) PCT Filed: Aug. 20, 2015

(86) PCT No.: PCT/JP2015/073311
§ 371 (c)(1),
(2) Date: Feb. 16, 2018

(87) PCT Pub. No.: WO2017/029742
PCT Pub. Date: Feb. 23, 2017

(65) Prior Publication Data
US 2020/0294776 A1 Sep. 17, 2020

(51) Int. Cl.
*H01J 27/26* (2006.01)
*H01J 37/08* (2006.01)
(Continued)

(52) U.S. Cl.
CPC ........ *H01J 37/32834* (2013.01); *H01J 27/26* (2013.01); *H01J 37/08* (2013.01);
(Continued)

(58) Field of Classification Search
CPC ...... H01J 27/26; H01J 37/32834; H01J 37/08; H01J 37/28; H01J 37/3244;
(Continued)

(56) References Cited

U.S. PATENT DOCUMENTS

2008/0142702 A1 6/2008 Frosien et al.
2009/0260112 A1 10/2009 Winkler et al.
(Continued)

FOREIGN PATENT DOCUMENTS

CN 101800187 A 8/2010
CN 102113094 A 6/2011
(Continued)

OTHER PUBLICATIONS

Chinese-language Office Action issued in counterpart Chinese Application No. 201580082518.7 dated Jan. 4, 2019 with English translation (seven (7) pages).
(Continued)

*Primary Examiner* — Nicole M Ippolito
(74) *Attorney, Agent, or Firm* — Crowell & Moring LLP (57) ABSTRACT

An ion beam device according to the present invention suppresses the fluctuation of an ion emission current by cleaning the inside of a chamber without entailing wear damage to an emitter electrode. The ion beam device includes a GFIS including an emitter electrode having a needle-shaped tip; an extraction electrode having an opening at a position spaced apart from the tip of the emitter electrode; and a chamber encapsulating the emitter electrode therein. The GFIS includes an ionizable gas introduction path for introducing an ionizable gas into the chamber in a state where a voltage equal to or more than a beam generating voltage is applied to the emitter electrode; and a cleaning gas introduction path for introducing a cleaning gas into the chamber in either a state where a voltage less than
(Continued)

the beam generating voltage is applied to the emitter electrode or a state where no voltage is applied to the emitter electrode. A pressure of the chamber with the cleaning gas introduced therein is higher than a pressure of the chamber when the ionizable gas is introduced therein.

16 Claims, 8 Drawing Sheets (51) Int. Cl.
  H01J 37/28 (2006.01)
  H01J 37/32 (2006.01)
(52) U.S. Cl.
  CPC .......... *H01J 37/28* (2013.01); *H01J 37/3244* (2013.01); *H01J 37/32541* (2013.01); *H01J 37/32743* (2013.01); *H01J 2237/002* (2013.01); *H01J 2237/0807* (2013.01)
(58) Field of Classification Search
  CPC .......... H01J 37/32541; H01J 37/32743; H01J 2237/002; H01J 2237/0807
  USPC .......... 250/423 R, 423 F, 492.1, 492.2, 492.3
  See application file for complete search history.

(56) References Cited

U.S. PATENT DOCUMENTS

| | | |
|---|---|---|
| 2009/0314951 A1 | 12/2009 | Biloiu et al. |
| 2010/0202093 A1 | 8/2010 | Yamawaku et al. |
| 2011/0189593 A1 | 8/2011 | Ogawa et al. |
| 2011/0233401 A1 | 9/2011 | Nishinaka et al. |
| 2012/0055506 A1* | 3/2012 | Moriya ............ H01L 21/02057 134/1 |
| 2013/0175459 A1* | 7/2013 | Klochkov ............... H01T 23/00 250/492.3 |
| 2019/0237288 A1* | 8/2019 | Platzgummer ...... H01J 37/1477 |

FOREIGN PATENT DOCUMENTS

| | | |
|---|---|---|
| CN | 102376513 A | 3/2012 |
| JP | 61-193347 A | 8/1986 |
| JP | 6-267475 A | 9/1994 |
| JP | 7-192669 A | 7/1995 |
| JP | 2008-153199 A | 7/2008 |
| JP | 2009-517846 A | 4/2009 |
| JP | 2011-181894 A | 9/2011 |
| JP | 2011-210492 A | 10/2011 |
| JP | 2011-527486 A | 10/2011 |
| JP | 2013-72099 A | 4/2013 |
| JP | 2014-149919 A | 8/2014 |
| WO | WO 2007/067296 A2 | 6/2007 |

OTHER PUBLICATIONS

Japanese-language Office Action issued in counterpart Japanese Application No. 2017-535204 dated Oct. 23, 2018 with English translation (12 pages).

International Search Report (PCT/ISA/210) issued in PCT Application No. PCT/JP2015/073311 dated Sep. 15, 2015 with English-language translation (three (3) pages).

Japanese-language Written Opinion (PCT/ISA/237) issued in PCT Application No. PCT/JP2015/073311 dated Sep. 15, 2015 (four (4) pages).

* cited by examiner

FIG. 8

ION BEAM DEVICE AND CLEANING METHOD FOR GAS FIELD ION SOURCE

TECHNICAL FIELD

The present invention relates to an ion beam device and a cleaning method for gas field ion source.

BACKGROUND ART

Patent literatures 1 and 2 disclose a high brightness gas field ion source (abbreviated as "GFIS") having minute bumps at a tip of an emitter electrode. Patent literatures 1 and 2 also disclose a focused ion beam (abbreviated as "FIB") device mounting the GFIS. The focused ion beam device generates a gas ion beam such as of hydrogen ($H_2$), helium (He), or neon (Ne).

As compared to gallium (Ga) focused ion beam (abbreviated as "Ga-FIB") generated by a liquid metal ion source (abbreviated as "LMIS"), a gas focused ion beam (abbreviated as "gas FIB") has the advantage of not causing Ga contamination of samples.

In addition to the advantage of not causing the gallium contamination of samples, the GFIS has the advantage of forming a finer beam than Ga-FIB. This is because, in the GFIS, the gas ions have a narrow energy width and the ion generation source has a small size.

The gas FIB device is used as a high-resolution scanning ion microscope. Specifically, the scanning ion microscope generates an image of a sample by detecting secondary particles emitted from the sample in synchronism with scanning ions on the sample.

In the GFIS, the ion emission current of ionizable gas is fluctuated by an impurity gas adsorbed onto or desorbed from the tip of the emitter electrode. The emitter electrode with the minute bumps may sometimes have an ionization site for ion emission limited to a few atoms at the tip of the emitter electrode. In this case, the ion emission current may fluctuate violently on the order of several dozen percent or by several times in association with the adsorption of the impurity gas onto the tip of the emitter electrode or the desorption of the impurity gas from the tip of the emitter electrode.

In order to suppress the fluctuation of the ion emission current, it has been conventional practices to previously create an ultra-high vacuum in an ion source chamber by baking and discharge, to use a high-purity ionizable gas, and to provide gas purification means in an ionizable gas supply system.

Patent literature 3 discloses a GFIS using hydrogen as the ionizable gas where a hydrogen gas supply system is provided with the gas purification device. Patent literature 4 discloses a method of cleaning deposits in a plasma chamber of the ion source. In this method, a hydrogen gas is introduced into the ion source so as to generate hydrogen plasma by electric discharge.

CITATION LIST

Patent Literature

Patent Literature 1: Japanese Unexamined Patent Application Publication No. Hei7(1995)-192669
Patent Literature 2: Japanese Unexamined Patent Application Publication (Translation of PCT Application) No. 2009-517846
Patent Literature 3: Japanese Unexamined Patent Application Publication No. 2011-181894
Patent Literature 4: Japanese Unexamined Patent Application Publication No. Hei6(1994)-267475

SUMMARY OF INVENTION

Technical Problem

Even in a case where the gas field ion source (GFIS) is provided with the above-described measure against the ion emission current fluctuation, the scanning ion microscope employing the GFIS may encounter a problem that sample images contain bright lines or dark lines. This is because the ion emission current fluctuates for a very short time of a second or less. Particularly, in a case where diatomic molecular hydrogen ($H_2$) or diatomic molecular nitrogen ($N_2$) is used as the ionizable gas, the above-described problem is likely to become obvious partly due to a phenomenon that the ionization site appears to vibrate irregularly.

The present invention has been accomplished in view of the above problem, and an object thereof is to provide an ion beam device adapted to suppress the fluctuation of ion emission current and a cleaning method for gas field ion source.

Solution to Problem

According to an aspect of the invention for solving the above problem, an ion beam device includes a gas field ion source including: an emitter electrode having a needle-shaped tip; an extraction electrode having an opening at a position spaced apart from the tip of the emitter electrode; and a chamber encapsulating the emitter electrode therein, and has a structure wherein the gas field ion source includes: an ionizable gas introduction path for introducing an ionizable gas into the chamber in a state where a voltage equal to or more than a beam generating voltage is applied to the emitter electrode; and a cleaning gas introduction path for introducing a cleaning gas into the chamber in either a state where a voltage less than the beam generating voltage is applied to the emitter electrode or a state where no voltage is applied to the emitter electrode, and wherein a pressure of the chamber with the cleaning gas introduced therein is higher than a pressure of the chamber when the ionizable gas is introduced therein.

Advantageous Effects of Invention

According to the present invention, an impurity gas that invades into chamber walls can be discharged by the cleaning gas introduced into the chamber. Thus, the concentration of the impurity gas relative to that of the ionizable gas can be reduced. This is effective to suppress rapid fluctuation of the ion emission current.

DESCRIPTION OF EMBODIMENTS

Embodiments of the present invention will hereinbelow be described with reference to the accompanying drawings. An ion beam device according to this embodiment includes a gas field ion source 1. When the gas field ion source 1, a cleaning gas is introduced from a cleaning gas supply system 60 into a chamber 10 at a pressure higher than an ionizable gas introduction pressure. While suppressing electric discharge in the chamber 10 filled with the cleaning gas, the cleaning gas is discharged from the chamber 10. This causes an impurity gas contained in inside walls and the like of the chamber 10 to be released into the chamber 10 and discharged along with the cleaning gas. After a cleaning process is completed, an ionizable gas is introduced from an ionizable gas supply system 30 into the chamber 10. An emitter electrode 21 is energized to emit ions from a tip of the emitter electrode 21.

The gas field ion source 1 of this embodiment performs the cleaning process using a cleaning gas and hence, can reduce the concentration of the impurity gas. That is, the gas field ion source 1 of this embodiment is capable of suppressing a rapid fluctuation of the ion emission current by reducing the concentration of the impurity gas relative to that of the ionizable gas. Therefore, the scanning ion microscope as an "ion beam device" employing the gas field ion source 1 of this embodiment achieves higher accuracies of quantitative measurement, processing and analysis using sample images of high image quality, which are less affected by noises such as bright lines and dark lines.

Example 1

Figure 1:
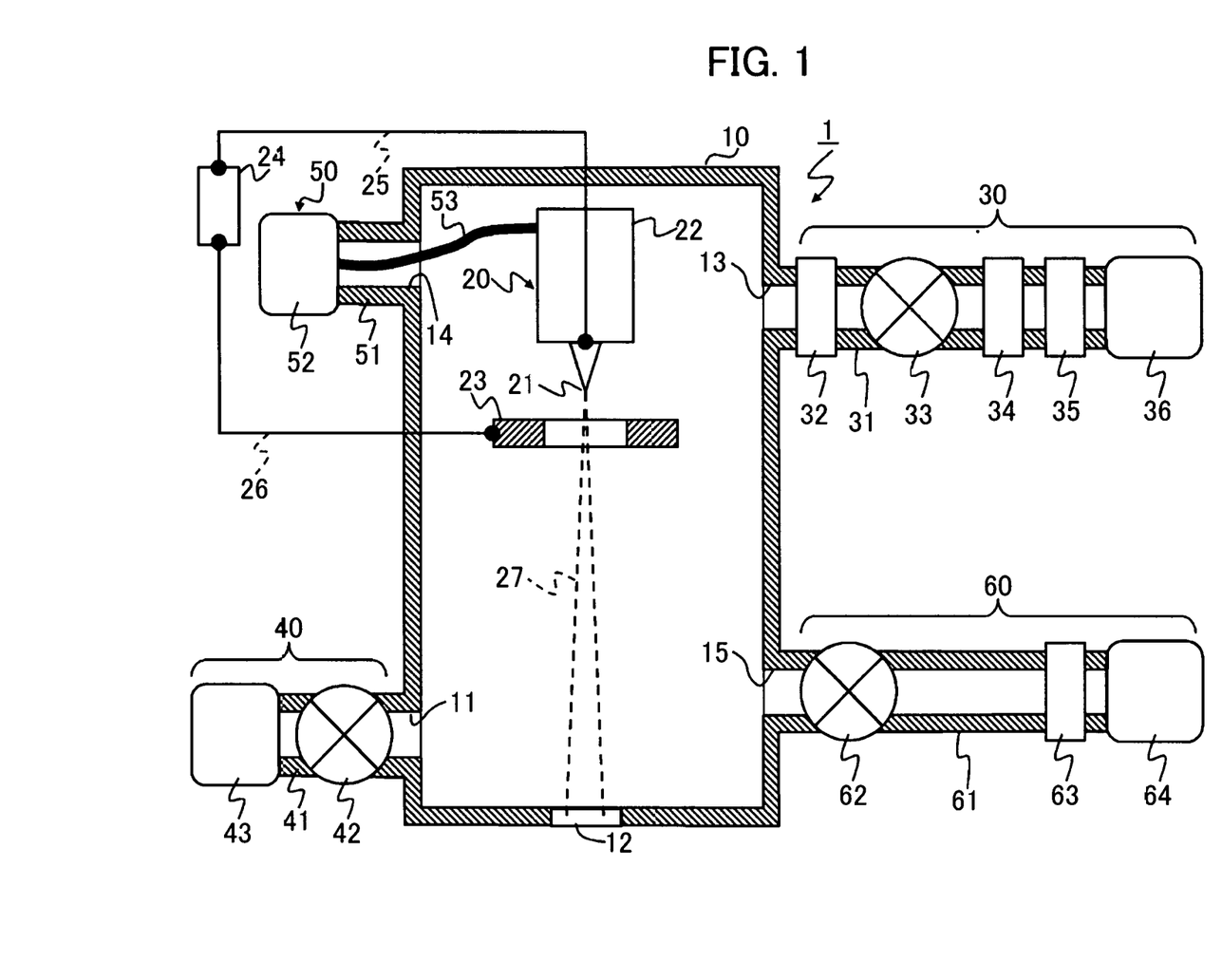
FIG. 1 is a diagram showing the overall structure of a gas field ion source according to a first example.

A first example is described with reference to FIG. 1 to FIG. 5. FIG. 1 is a diagram showing the overall structure of the gas field ion source 1. Hereinafter, the gas field ion source 1 will be referred to as GFIS 1 in some cases.
<Structures>

The GFIS 1 includes, for example, the chamber 10, an ion generator 20, the ionizable gas supply system 30, an exhaust system 40, a cooling system 50, and the cleaning gas supply system 60.

The chamber 10 used as a vacuum vessel contains therein the emitter electrode 21 of the ion generator 20. The chamber 10 is formed with: an exhaust port 11; a differential pumping port 12; an ionizable gas supply port 13; a cooling system connection port 14; and a cleaning gas supply port 15.

The gas in the chamber 10 is discharged through the exhaust port 11. An ion beam 27 is supplied to an unillustrated ion optical system 120 (see FIG. 7) via the differential pumping port 12 formed in the chamber 10 in opposed relation to the emitter electrode 21. The ionizable gas supply port 13 is connected with the ionizable gas supply system 30 for supplying the ionizable gas. The emitter electrode 21 is cooled as connected to the cooling system 50 via the cooling system connection port 14. The cleaning gas supply port 15 is connected with the cleaning gas supply system 60 for supplying the cleaning gas.

The ion generator 20 includes, for example, the emitter electrode 21, an emitter holder 22, an extraction electrode 23, a power supply 24, and electric wires 25, 26.

The emitter holder 22 retaining the emitter electrode 21, and the extraction electrode 23 are retained at places in the chamber 10. The tip of the emitter electrode 21 is formed in a needle shape. The extraction electrode 23 centrally formed with an opening is disposed at place spaced apart from the tip of the emitter electrode 21. The ionizable gas through the ionizable gas supply system 30 is supplied from the ionizable gas supply port 13 to an area around the tip of the emitter electrode 21.

The emitter electrode 21 has its tip formed in a trigonal nano-pyramid structure by applying an iridium (Ir) coating on a needle-shaped substrate of tungsten (W), followed by annealing. The foremost tip of the emitter electrode 21 is a single atom.

A positive side of the extraction power supply 24 and the emitter electrode 21 are electrically connected via the electric wire 24. A negative side of the extraction power supply 24 and the extraction electrode 23 are electrically connected via the electric wire 25.

The pressure of the ionizable gas in the chamber 10 is regulated by balance between the amount supplied from the ionizable gas supply system 30 and the amount of emission from the exhaust port 11 and the differential pumping port 12. When the extraction power supply 24 applies a high voltage between the emitter electrode 21 and the extraction electrode 23 in a direction to apply a positive voltage to the emitter electrode 21 side, gaseous ionization is produced at a certain threshold voltage or above so that the ion beam 27 is emitted from the tip of the emitter electrode 21.

The emitter electrode 21 is connected to the cooling system 50 via the emitter holder 22 and a thermal connector 53 which have high thermal conductivity. A cooling device 50 of the cooling system 50 cools the emitter electrode 21 by releasing heat transferred from the emitter electrode 21. By cooling the emitter electrode 21 by means of the cooling system 50, the current of the ion beam 27 can be increased so that the ion beam 27 can be increased in brightness.

It is noted that a mechanism for retaining the emitter electrode 21 and the extraction electrode 23 in the chamber 10, a mechanism for adjusting the positions of the emitter electrode 21 and the extraction electrode 23, an exhaust system beyond the differential pumping port 12, and the like are not necessary for the understanding or implementing the present invention and hence, the description thereof is dispensed with.

A structure of the ionizable gas supply system 30 is described. The ionizable gas supply system 30 includes, for example, an ionizable gas supply pipe 31, a flow regulating mechanism 32, a valve 33, a gas purifier 34, a pressure regulator 35, and a gas cylinder 36.

The gas cylinder 36 filled with the ionizable gas is disposed on one side of the ionizable gas supply pipe 31. The other side of the ionizable gas supply pipe 31 is connected to the ionizable gas supply port 13. The ionizable gas is a helium gas (He). The temperature of the emitter electrode 21 is maintained at about 40K in a normal mode to perform an ion emission operation.

The pressure regulator 35 mounted to the supply pipe 31 as located on a gas output side of the gas cylinder 36 adjusts the pressure of the ionizable gas introduced into the chamber 10 to a predetermined pressure value. The gas purifier 34 mounted to the supply pipe 31 at place downstream from the pressure regulator 35 removes the impurity gas contained in the ionizable gas and allows the ionizable gas free from the impurity gas to pass therethrough. The gas purifier 34 is configured as a getter-type gas purifier, for example.

The valve 33 is mounted to the supply pipe 31 at place downstream from the gas purifier 34. The valve 33 is opened or closed so as to bring the supply pipe 31 into communication or to shut off the supply pipe. The flow regulating mechanism 32 is mounted to the supply pipe 31 at place between the ionizable gas supply port 13 and the valve 33. The flow regulating mechanism 32 including a needle valve regulates the flow rate of the ionizable gas introduced into the chamber 10.

A structure of the exhaust system 40 is described. The exhaust system 40 maintains the chamber in vacuo or in low pressure state by sucking and discharging the gas in the chamber 10. The exhaust system 40 includes, for example, an exhaust pipe 41, an exhaust valve 42, and an exhaust pump 43.

One side of the exhaust pipe 41 is connected to the exhaust pump 43 while the other side of the exhaust pipe 41 is connected to the exhaust port 11. The exhaust valve 42 for opening or closing the exhaust pipe 41 is interposed between the exhaust port 11 and the exhaust pump 43.

A structure of the cleaning gas supply system 60 is described. The cleaning gas supply system 60 includes, for example, a cleaning gas supply pipe 61, a valve 62, a pressure regulator 63, and a gas cylinder 64. The gas cylinder 64 filled with the cleaning gas is disposed on one side of the cleaning gas supply pipe 61. The other side of the cleaning gas supply pipe 61 is connected to the cleaning gas supply port 15.

The pressure regulator 62 connected to an output side of the gas cylinder 64 adjusts the pressure of the cleaning gas supplied from the gas cylinder 64 to the supply pipe 61 to a predetermined pressure value. The valve 62 is mounted to the supply pipe 61 at place between the cleaning gas supply port 15 and the pressure regulator 62, serving to open or close the supply pipe 61.

Figure 8:
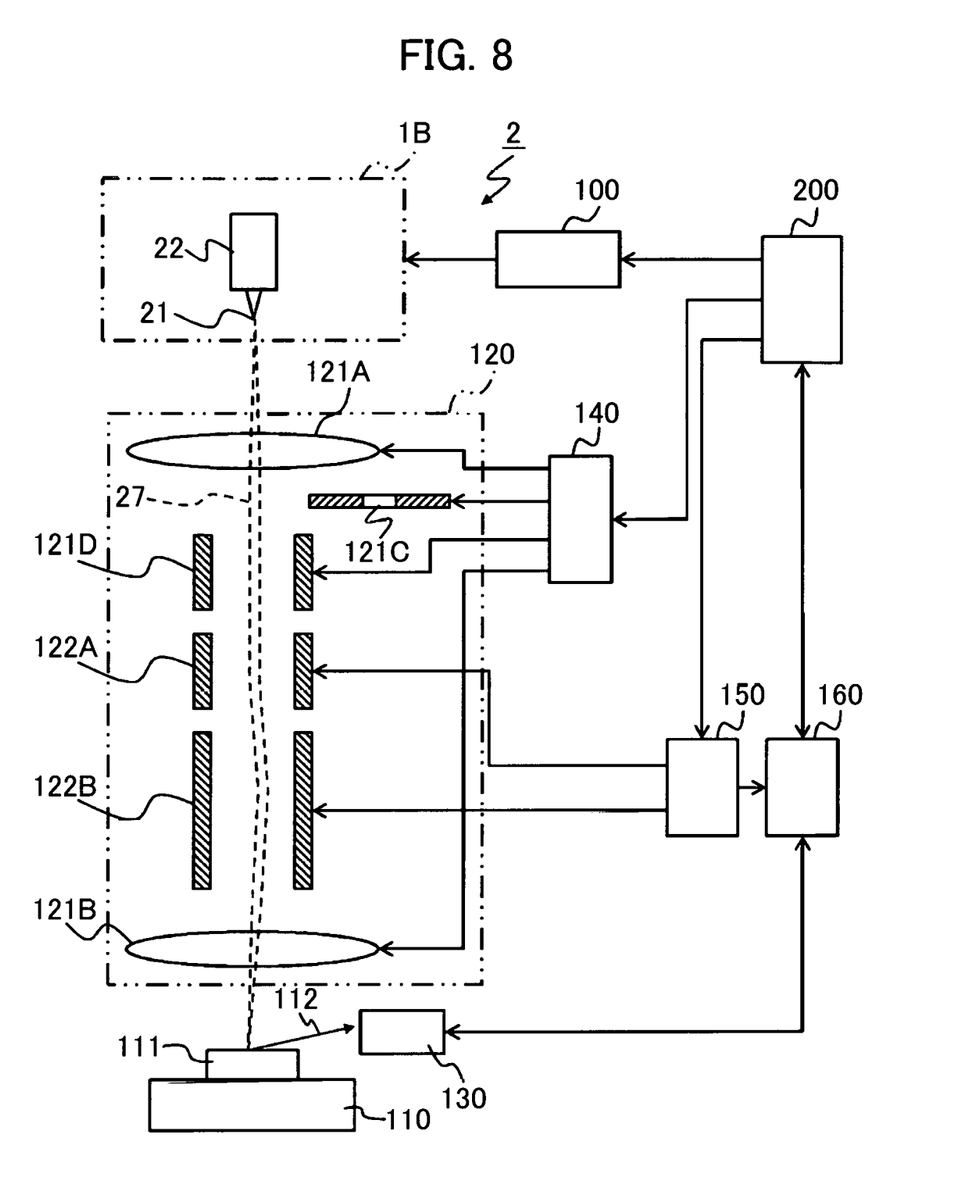
FIG. 8 is a diagram showing the overall structure of a gas field ion source according to a seventh example.

The operations of the above-described ion generator 20, ionizable gas supply system 30, exhaust system 40, cooling system 50, and cleaning gas supply system 60 are controlled by an unillustrated ion source control unit 100 (see FIG. 8).

<Origin of Impurity Gas>

The impurity gas is described. In any applications of the ion beam 27, it is important to ensure that the ion beam has a tempostable current. The stability of ion emission from the emitter electrode 21 is affected by the abundance of the impurity gas contained in the ionizable gas.

The present inventors have obtained the following findings on the impurity gas from the previous studies. First, the impurity gas is mostly released from various walls in the chamber 10 and a wall inside the pipe in vicinity of the ionizable gas supply port 13 when the ionizable gas is introduced into the chamber 10. Therefore, if the ionizable gas to be supplied is previously purified by removing impurities therefrom, the impurity gas released in the chamber 10 cannot be reduced. Second, the release of the impurity gas in the course of introducing the ionizable gas into chamber 10 cannot be suppressed even though a super-high vacuum is created in the chamber 10 by baking and discharge. Third, the partial pressure of the impurity gas to that of the ionizable gas substantially stays constant. Fourth, if the pressure of the ionizable gas is increased to increase the brightness of the ion beam 27, the amount of impurity gas is also increased. The increase of the impurity gas results in the increase of fluctuation of the ion beam 27. The impurity gas is mainly composed of carbon monoxide (CO), methane ($CH_4$) and the like.

<Cleaning of Ion Source>

The present inventors have obtained the following findings as a result of further investigation on the impurity gas. Specifically, the partial pressure of the impurity gas to that of the ionizable gas was reduced to a unit equivalent to integral multiples of the previous value by introducing the ionizable gas into the chamber 10 at a pressure several orders of magnitude higher than the pressure of normal ion emission operation, followed by discharging the high-pressure ionizable gas from the chamber 10. The introduction and discharge of the high-pressure ionizable gas may be repeated several times.

It is known that the amount of gas released from the walls of the chamber 10 into vacuum is reduced if the chamber 10 is baked at high temperatures and allowed to cool to normal temperatures. The above-described process exhibits a similar phenomenon to this. Namely, the production of impurity gas during the course of introducing a low-pressure ionizable gas can be suppressed by introducing into the chamber 10 an ionizable gas at higher pressure than a pressure when the ion emission operation is performed (the ion beam is generated), followed by discharging the gas. It is noted that the amount of impurity gas returns to an original level if the chamber 10 is opened to the atmosphere in order to replace the emitter electrode 21.

The process of introducing the ionizable gas into the chamber 10 at pressure higher than that of the normal ion emission operation followed by discharging the gas is considered as one of cleaning processes because the process lowers the partial pressure of the impurity gas to that of the ionizable gas. The present inventors infer that this cleaning process is a phenomenon that the molecules of high-pressure ionizable gas diffuse and intrude through the wall surfaces of the chamber 10, physically or chemically reacting with the molecules of the impurity gas.

The above-described cleaning process found out by the present inventors is a phenomenon absolutely different from a cleaning process for plasma ion source where plasma is used for removing deposits on the wall. According to the cleaning process for plasma ion source, the cleaning gas is introduced into the chamber where plasma is generated by electric discharge so as to remove the deposits on the wall by means of high-energy charged particles from plasma.

However, if electric discharge is generated in the GFIS 1, the emitter electrode 21 and materials of structures therearound are scattered away. As a result, the tip of the emitter electrode will be broken or irreparably damaged. In the GFIS 1 of this example, therefore, the cleaning gas at higher pressure than the ionizable gas is introduced into the chamber 10 and then is directly discharged without generating electric discharge.

Operations of the Example

According to this example, the GFIS 1 is provided with the cleaning gas supply port 15 and the gas supply system 60 connected thereto such as to introduce the cleaning gas into the chamber 10.

The GFIS 1 includes a cleaning mode to perform the cleaning process in addition to the normal mode to generate the ion beam. In the cleaning mode, after disabling the cooling of the emitter electrode 21 by the cooling system 50, the chamber 10 is filled with the cooling gas through the cleaning gas supply port 15 at high pressure in the range of several dozen Pa to the atmospheric pressure. Subsequently, the exhaust valve 42 of the exhaust system 40 is opened to discharge the high-pressure cleaning gas through the exhaust port 11. The impurity gas released from the walls and the like of the chamber 10 is discharged along with the cleaning gas to the outside of the chamber 10.

When the pressure of the gas is relatively lowered after the cleaning mode operation is done, the concentration of the impurity gas is decreased. While the cleaning mode is performed, the cooling of the emitter electrode 21 is disabled. The reasons for this are as follows. First, the higher the wall temperature, the greater the cleaning effect. Second, heat transfer by the cleaning gas is increased during the cleaning mode operation and hence, the cooling process cools down the chamber 10 per se, resulting in a problem of dew formation or frost formation on the outside of the chamber. The dew or frost formed on the outside of the chamber 10 is liable to affect the operations of the GFIS 1. In this example, therefore, the cooling system 50 is disabled during the cleaning mode operation.

As will be described hereinafter, the cleaning mode includes: a method where the cleaning gas at a relatively high pressure is introduced into the chamber only for a short time, and then discharged; and a method where the cleaning gas at a relatively low pressure is introduced into the chamber for long hours while discharging the gas. In the latter case, load on the exhaust pump 43 of the exhaust system 40 is reduced although the cleaning takes a long time.

In the normal mode to perform the ion emission operation, the ionizable gas (He) is supplied to the area around the emitter electrode 21 at low pressure of several Pa or less. Further in the normal mode, the emitter electrode 21 is cooled by the cooling system 50. The temperature of the emitter electrode 21 is maintained at about 40K.

The upper limit of the pressure of the ionizable gas introduced into the chamber 10 in the normal mode depends upon the following two conditions. One of the conditions is to prevent glow discharge in the GFIS 1. The other condition is to prevent excess heat transfer in the GFIS 1.

As described above, the pressure condition in the chamber 10 can be clearly divided between the low pressure for the normal mode and the high pressure for the cleaning mode with several Pa as a boundary value. Primarily, it is desirable to increase the pressure by one digit or more in order to clarify the cleaning effect in the cleaning mode operation.

Figure 2:
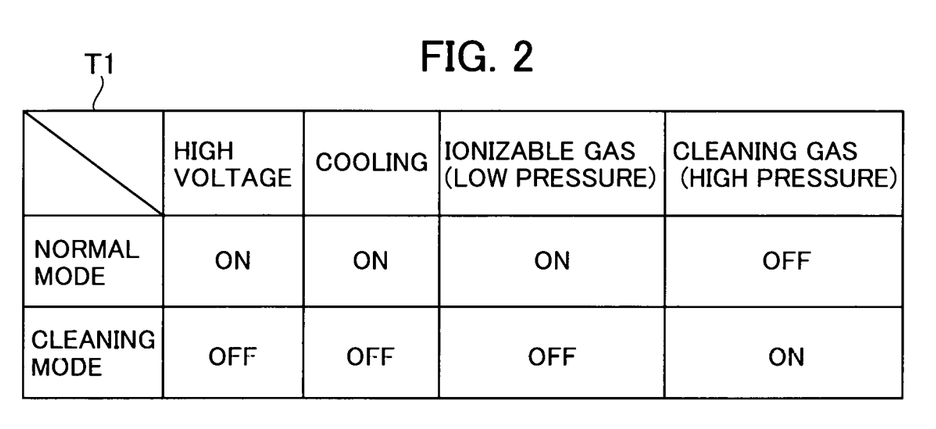
FIG. 2 is an explanatory chart showing that the gas field ion source varies in system state between a normal mode and a cleaning mode.

FIG. 2 shows a system state of the GFIS in the normal mode versus a system state of the GFIS in the cleaning mode. In the normal mode to generate the ion beams, a voltage is applied to the emitter electrode 21 while the cooling system 50 operates to cool the emitter electrode 21. The ionizable gas at low pressure is introduced to the area around the tip of the emitter electrode 21.

The pressure of the ionizable gas in the normal mode is set to a value in the range of 0.05 to 0.1 Pa, for example. The pressure of the ionizable gas in the chamber 10 is regulated by the flow regulating mechanism 32. Alternatively, the pressure of the ionizable gas in the chamber 10 can also be regulated by way of the opening position of the exhaust valve 42 of the exhaust system 40. Incidentally, the cleaning gas is not introduced into the chamber 10 in the normal mode.

In the normal mode, on the other hand, the emitter electrode 21 is not energized in order to perform the cleaning process without generating the electric discharge while the cooling system 50 is deactivated so as to prevent the dew formation and the like in the chamber 10. Then, the cleaning gas is introduced into the chamber 10 at high temperature. The ionizable gas is not introduced into the chamber 10 in the cleaning mode.

The cleaning gas of this example is a helium gas (He) similarly to the ionizable gas. In the cleaning mode to reduce the impurity gas, the temperature of the emitter electrode 21 is brought close to room temperature by disabling the cooling of the emitter electrode 21. A cleaning gas introduction path includes in this order: the gas cylinder 64; the pressure regulator 63 capable of regulating absolute pressure; the open valve 62; and the cleaning gas supply port 15.

The valve 33 of the ionizable gas supply system 30 is closed in the cleaning mode. The ionizable gas is not supplied to the chamber 10 in the cleaning mode. The "He" pressure in the cleaning mode is roughly set to 0.1 MPa on the basis of absolute pressure. This pressure is equivalent to a value when the exhaust valve 42 of the exhaust system 40 is closed and is determined by the pressure regulator 63. In the cleaning mode, an exhaust system (not shown) beyond the differential pumping port 12 is also shut off.

Figure 3:
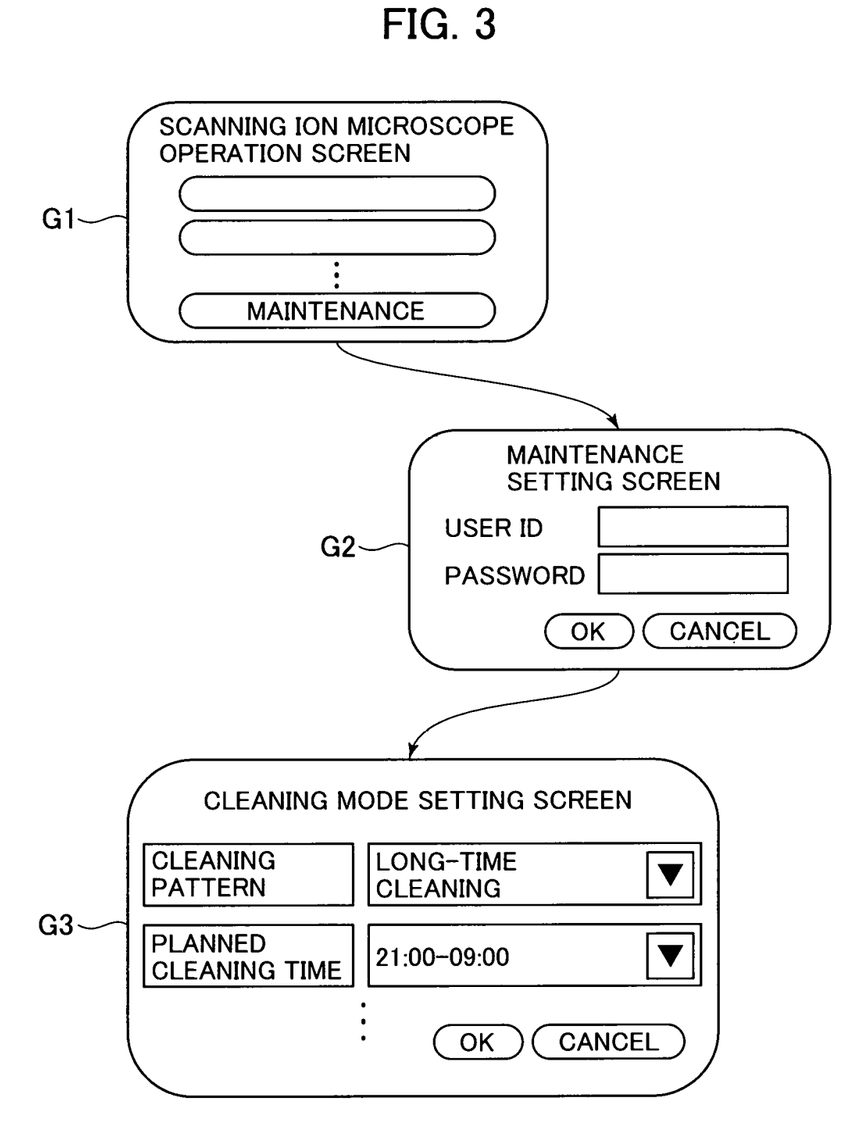
FIG. 3 shows an example of setting screens.

FIG. 3 shows an example of screens for setting the cleaning mode. A user can shift a screen display to a maintenance setting screen G2 by selecting a maintenance menu from an operation screen G1 provided by a microscope control unit 200.

The user can access a cleaning mode setting screen G3 located under the maintenance setting screen G2 by inputting authentication information such as a user ID and password. Biometric information can be used in place of the user ID and password. Successfully authenticated, the user can set, for example, a cleaning pattern, a planned cleaning time and the like via the cleaning mode setting screen G3.

As for the cleaning pattern, it is possible to previously prepare, for example, a pattern of cleaning for long hours at low pressure (but higher than the pressure in the normal mode), a pattern of cleaning for a short time at high pressure, a pattern of repeating short-time cleaning processes more than once, and the like. The planned cleaning time means the time of day when the cleaning mode is performed. A configuration may be made such that only date and time to start cleaning is set or that the date and time to start cleaning and the date and time to end cleaning are set.

Figure 4A:
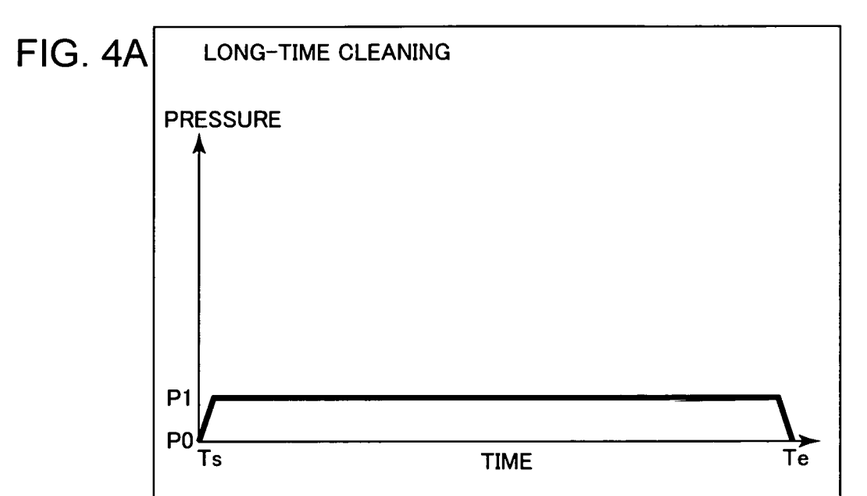
FIG. 4A shows a mode where a long-time cleaning with a cleaning gas at a relatively low pressure is performed.

FIG. 4 shows an example of the cleaning patterns included in the cleaning mode. FIG. 4(a) shows a long-time cleaning pattern where a long-time cleaning process by introducing a low-pressure cleaning gas into the chamber 10 is performed in parallel with discharging the gas. In the long-time cleaning pattern, the cleaning gas is introduced into the chamber 10 at a pressure P1 that is higher than the pressure of the ionizable gas in the normal mode but lower than a pressure of the gas used in a short-time cleaning pattern. The pressure P1 can be set to several dozen Pascal. The GFIS 1 is cleaned with the cleaning gas for a period from a cleaning start time Ts to a cleaning end time Te. P0 denotes a value equivalent to or close to vacuum. In the long-time cleaning pattern, the cleaning is performed for a period of several hours to a dozen hours, for example.

Figure 4B:
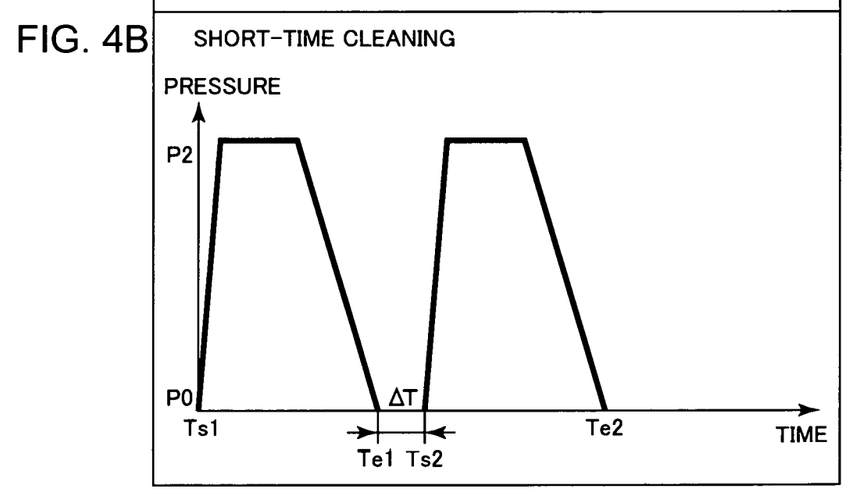
FIG. 4B shows a mode where a short-time cleaning with a cleaning gas at a relatively high pressure is performed.

FIG. 4(b) shows the short-time cleaning pattern where the cleaning process is performed only for a short time by introducing a high-pressure cleaning gas into the chamber 10. A pressure P2 of the cleaning gas is set to a value higher than the pressure P1 of the long-time cleaning pattern. The pressure P2 may be set to a value close to the atmospheric pressure.

The short-time cleaning process may be performed once or plural times. According to the example shown in FIG. 4(b), the first cleaning is performed from a cleaning start time Ts1 to a cleaning end time Te1. After the lapse of time ΔT from the end of the first cleaning, the second cleaning is performed from a cleaning start time Ts2 to a cleaning end time Te2. One short-time cleaning process takes several hours. The short-time cleaning process may be repeated three times or more.

Figure 5:
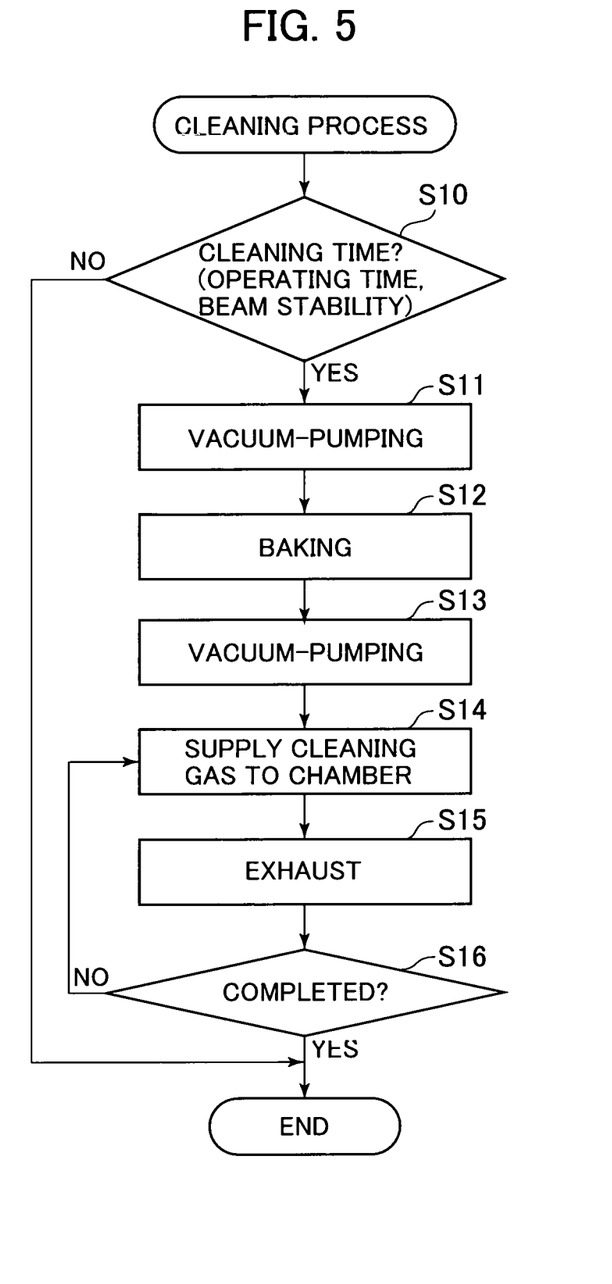
FIG. 5 is a flow chart showing the steps of a cleaning process.

FIG. 5 is a flow chart showing the steps of a cleaning process. An ion source control unit 100 or a microscope control unit 200 to be described hereinafter with reference to FIG. 8 performs the cleaning process in a predetermined timing. The following description is made on the assumption that an operating subject is "control unit".

The control unit determines whether or not a cleaning time has come (S10). The cleaning time means a case, for example, where a previously defined certain cleaning start condition is satisfied. The cleaning start condition includes: a case where a predetermined length of operating time has passed since the previous cleaning end time; a case where ion emission stability has decreased by more than a predetermined value from the current fluctuation of the ion beam 27; a case where the chamber 10 is opened to the atmosphere for replacement of the emitter electrode 21; a case where the operating time of the GFIS 1 reaches a predetermined operating hours; a case where the user gives an instruction to perform cleaning; and the like. More than one of these cleaning start conditions may be used in combination.

The cleaning process can be divided into two steps. The first step is a cleaning step by baking and vacuum-pumping. The second step is a cleaning step by introducing the cleaning gas. The first cleaning stem may also be called a pre-cleaning step or cleaning preparatory step, for example. The second cleaning step may also be called a post-cleaning step or main cleaning step.

The control unit operates the exhaust system 40 to discharge the chamber 10 to a vacuum (S11) and then, performs baking (S12). The control unit operates the exhaust system 40 again to discharge the chamber 10 to a vacuum so as to discharge the impurity gas released from the walls of the chamber by baking (S13).

Subsequently, the control unit supplies the cleaning gas to the chamber 10 by means of the cleaning gas supply system 60 (S14). When the cleaning gas is introduced into the chamber 10, the impurity gas is released from the walls of the chamber 10. The control unit operates the exhaust system 40 to exhaust the cleaning gas and the impurity gas from the chamber 10 (S15).

The control unit determines whether or not to terminate the cleaning process (S16). In a case where a predetermined cleaning end condition is satisfied, the control unit determines the cleaning process to be completed (S16: YES) and terminates the process. The cleaning end condition includes, for example, a case where the user-specified number of cleaning processes are done, a case where the user gives an instruction to terminate the cleaning process, a case where a user-specified cleaning end time is reached, and the like.

According to the example shown in FIG. 5, the control unit repeats the introduction and discharge of the cleaning gas till the predetermined number of cleaning processes are done (S16: NO→S14, S15).

In the GFIS 1 of this example, as described above, after the chamber 10 is filled with the cleaning gas, the exhaust valve 42 is opened to discharge the cleaning gas by means of the exhaust pump 43. The exhaust pump 43 has a structure, for example, where a turbo-molecular pump and a dry pump are coupled together. The dry pump is operated alone before the exhaust valve 42 is opened. When the degree of vacuum in the chamber 10 rises, the turbo-molecular pump is operated, as well. The sequence of charging and discharging the cleaning gas may be repeated more than once.

In the case where the GFIS 1 is opened to the atmosphere for the purpose of replacement of the emitter electrode 21 or the like, it is desirable to clean the GFIS 1 by performing the introduction and discharge of the cleaning gas, as described above. However, the cleaning process may be performed under a little looser condition in a case where the GFIS 1 is purged with nitrogen gas before opened to the atmosphere, or a case where the gas cylinder 36 of ionizable gas is simply replaced or where the type of ionizable gas is changed.

Specifically, the control unit may adjust the pressure of the cleaning gas in the chamber 10 to a range of 10 to 100 Pa by slightly opening the exhaust valve 42 of the exhaust system 40 and slightly opening the valve 62 of the cleaning gas supply system 60. The control unit can clean the GFIS by consecutively performing the supply and discharge of the cleaning gas while operating both the turbo-molecular pump and the dry pump of the exhaust pump 43. After the cleaning by consecutively performing the supply and discharge of the cleaning gas is performed for about 24 hours, the effect to reduce impurities is saturated. After this, therefore, even a shorter cleaning time can promise the cleaning effect.

According to the GFIS 1 of this example having such a structure, the concentration of the impurity gas contained in the ionizable gas (He) in the normal mode can be reduced by performing the cleaning mode. Therefore, this example can reduce the current fluctuation of the ion beam 27.

Helium gas has a high ionization field. Therefore, if the emitter electrode 21 carries out ionization while the cleaning gas is introduced into the chamber 10, atoms at the tip of the emitter electrode 21 are at risk of being etched by the ionization field and the impurity gas. In contrast, the GFIS 1 of this example can prevent damages on the tip of the emitter electrode 21 and achieve increased operation rate thereof because the GFIS 1 in the cleaning mode discharges the cleaning gas from the chamber 10 while preventing the electric discharge.

In this example, the cleaning mode is performed at room temperature. Alternatively, the cleaning mode may also be performed while heating the chamber 10 and pipes around the ionizable gas supply port 13 to about 200° C., for example. Since the cooling system 50 is disabled in the cleaning mode, the cleaning process can be performed while heating the chamber 10 and the pipes around ionizable gas supply port 13.

In this example, both the ionizable gas and the cleaning gas are composed of He so that the gas cylinders, the pipes and the like can be partly shared between the ionizable gas supply system 30 and the gas supply system 60. This results in the reduction of manufacturing costs of the GFIS 1. However, the introduction pressure of the cleaning gas and the introduction pressure of the ionizable gas significantly differ between the cleaning mode and the normal mode. Therefore, the pressure control becomes easier in a case where separate gas introduction paths for these gases are provided.

In this example, the ionizable gas and the cleaning gas are based on the same "He". However, the same effect can be achieved if helium gas is replaced by another rare gas such as neon (Ne) or another inert gas such as N2 and H2.

The sequence of the cleaning process shown in FIG. 5 can be full-automatically performed by the control unit. Alternatively, the user can set some of the conditions so as to permit the cleaning process to be semi-automatically performed.

Example 2

A second example is described. Since the following examples including this example are equivalent to modifications of the first example, the description focuses on difference from the first example. The basic structure and operations of the GFIS 1 are the same as those of the first example. The difference from the first example lies in the details of the cleaning gas.

Just as in the first example, both the cleaning gas and the ionizable gas of this example are the helium gas. It is noted, however, that both the cleaning gas and the ionizable gas of the first example are the helium gas having exactly the same degree of purity. In this example, the cleaning gas has lower purity than the ionizable gas. In this example, the helium gas in the gas cylinder 64 has lower purity than the helium gas in the gas cylinder 36.

Commercially available helium gas normally has sufficiently high purity. Therefore, the amount of impurity gas present in this helium gas is sufficiently smaller than the amount of the impurity gas generated in the chamber 10 in the cleaning mode. Hence, the purity of the cleaning gas does not affect the operation in the cleaning mode. Even in a case where the commercially available helium gas is used as the cleaning gas, the same effect as that of the first example can be achieved. It is not so necessary to pay much attention to the purity of the cleaning gas in the first example, as well. Therefore, the cleaning gas supply system 60 is not provided with the gas purifier.

This example having such a structure achieves the same working effect as the first example. Further, this example can use the commercially available helium gas as it is, because the purity of the cleaning gas is lower than that of the ionizable gas. As a result, this example can reduce the purchase expense for massively consumed cleaning gas, achieving the reduction of running cost of the GFIS 1.

Example 3

A third example is described. The basic structure and operations of the GFIS 1 according to the third example are also the same as those of the first example. The difference between this example and the first example lies in the details of the cleaning gas. This example uses a hydrogen gas (H2) as the cleaning gas.

The first example and the second example use the helium gas as the cleaning gas as well as the ionizable gas. Under the same pressure condition, however, a greater impurity-gas reduction effect can be obtained by using, as the cleaning gas, a gas having a smaller molecular weight than the ionizable gas. Above all, the hydrogen gas used as the cleaning gas provides a significant impurity-gas reduction effect. If the cleaning gas is either the inert gas or the hydrogen gas, there is no fear that a chemically active impurity gas such as will affect the tip of the emitter electrode 21 is generated anew.

This example having such a structure achieves the same working effect as the first example. Further, this example is adapted to remove more impurity gas than the first example because hydrogen having a smaller molecular weight than helium used as the ionizable gas is used as the cleaning gas. Therefore, this example can stabilize the current of the ion beam 27 more than the first example.

This example has illustrated the case where the helium gas is used as the ionizable gas and the hydrogen gas having a smaller molecular weight is used as the cleaning gas. Alternatively, neon (Ne) or nitride (N2) may be used as the ionizable gas while helium or hydrogen having a smaller molecular weight than neon or nitride may be used as the cleaning gas.

Example 4

A fourth example is described. The basic structure and operations of the GFIS 1 according to this example are the same as those of the first example. The difference between this example and the first example lies in the details of the cleaning gas.

This example employs the inert gas as the cleaning gas and selects a gaseous species having the smallest molecular weight from the inert gases. The cleaning gas of this example is a mixture of helium gas (He) and hydrogen gas (H2) that has a smaller molecular weight than helium gas. The mixing ratio of the hydrogen gas is 4%, for example. Incidentally, the helium gas is used as the ionizable gas just as in the first example.

This example having such a structure achieves the same working effect as the first example. Further in this example, the mixture gas obtained by blending hydrogen gas into helium gas in a predetermined proportion is used as the cleaning gas. Hence, this example provides a higher cleaning effect than the case where the helium gas is used alone as the cleaning gas. In the normal mode to perform the ion emission operation, therefore, this example achieves a greater reduction of the concentration of the impurity gas relative to the ionizable gas. As a result, the current of the ion beam 27 can be more stabilized in this example.

Although the cleaning gas in this example contains the hydrogen gas, an explosion-proof device need not be provided because the hydrogen gas is blended into the helium gas in a mixing ratio lower than an explosion limit. Therefore, the total device cost of the GFIS 1 can be reduced.

In this example, the helium gas is also blended into the cleaning gas just as used in the ionizable gas. However, this is not necessarily required. The same effect can be obtained by using, as the cleaning gas, a mixture of nitrogen gas (N2) containing 4% hydrogen gas (H2). Otherwise, the same effect can also be obtained by using nitrogen gas as the ionizable gas and using a mixture of helium gas containing 4% hydrogen gas, as the cleaning gas.

Example 5

A fifth example is described with reference to FIG. 6. A GFIS 1A of this example is substantially the same as the GFIS 1 of the first example. The difference from the first example lies in that the hydrogen gas (H2) is used as the ionizable gas, that an ionizable gas supply system 30A has a different structure, and that the details of the cleaning gas are different.

Just as that of the fourth example, the cleaning gas of this example is a mixture of helium gas and hydrogen gas and the mixing ratio of the hydrogen gas is 4% that is equal to or less than the explosion limit.

A description is made on the structure of the ionizable gas supply system 30A. The ionizable gas supply system 30A includes, for example, the ionizable gas supply pipe 31, the pressure regulator 35, a gas supply valve 38, permselective means 37, and the gas cylinder 36. With the gas cylinder 36 located on the most upstream side, the pressure regulator 35, gas supply valve 38, and permselective means 37 in this order are arranged on the ionizable gas supply pipe 31.

The ionizable gas supply system 30A of this example is connected with an ionizable gas exhaust system 70. This exhaust system 70 includes an exhaust pipe 71, an exhaust valve 72 for opening and closing the exhaust pipe 71, and an exhaust pump (included in the exhaust system 70). One side of the exhaust pipe 71 is located between the gas supply valve 38 and the permselective means 37 and connected to some midpoint of the ionizable gas supply pipe 31.

In this example, the hydrogen gas as the ionizable gas is supplied from the small gas cylinder 36 at a low pressure (1 MP or less). Further, this example is adapted to purify the ionizable gas by passing the gas through the permselective means 37 and to supply the purified ionizable gas to the chamber 10. The permselective means 37 is composed of a palladium-copper alloy film, for example.

Since the pressure of the gas cylinder 36 for supplying the hydrogen gas as the ionizable gas is low, the impurity gas generated in the gas cylinder has a significant influence and the concentration of the impurity gas in the gas cylinder increases with time. If the impurity gas is purified with the getter-type gas purifier, the gas cannot be purified so much as when the purifier is used with a high-pressure gas cylinder. This is because the pressure of the gas cylinder 36 is so low.

In this example, therefore, the ionizable gas supply pipe 31 is provided with the permselective means 37 composed of the palladium-copper alloy film at place on a downstream side thereof and in vicinity of the ionizable gas supply port 13. This permselective means 37 can remove the impurity gas except for the hydrogen gas.

The supply of the hydrogen gas as the ionizable gas can be controlled by way of a supply pressure determined by the pressure regulator 35. The pressure regulator 35 can adjust absolute pressure. The supply of the hydrogen gas is substantially proportional to the square root of the supply pressure.

The palladium-copper alloy film forming the permselective means 37 is used at room temperature. Although the permeation of hydrogen gas can be increased by heating the palladium-copper alloy film, the emitter electrode 21 as the destination of introduced hydrogen gas is cooled by the cooling system 50. It is therefore undesirable to supply the high-temperature hydrogen gas to the GFIS 1A cooled by the cooling system 50. For the sake of stable operation of the GFIS 1A, this example does not heat the permselective means 37 but uses the permselective means at room temperature.

This example is configured such that when the hydrogen gas as the ionizable gas is supplied to the chamber 10, the gas supply valve 38 is closed after the gas pressure is regulated by the pressure regulator 35. Thus, the influence of subtle pressure fluctuation through the pressure regulator 35 can be eliminated. Furthermore, even if the palladium-copper alloy film of the permselective means 37 should be broken, the amount of hydrogen gas leaked into the chamber 10 can be limited. Even in the event that the hydrogen gas leaks through the permselective means 37 by any chance, the influence of the gas leakage on the exhaust system 40 and devices beyond the differential pumping port 12 can be minimized by closing the gas supply valve 38 after the pressure regulation by the pressure regulator 35.

Although the exhaust valve 72 is normally used in a closed position, the valve is opened in a certain case so as to permit the exhaust system 70 to discharge the hydrogen gas upstream of the permselective means 37. The certain case includes a case where the supply of the ionizable gas to the chamber 10 is stopped, a case where the permeation of ionizable gas is lowered due to the impurity gas accumulated on the upstream side of the palladium-copper alloy film as a result of the long-term use of the palladium-copper alloy film, and the like.

The example having such a structure achieves the same working effect as the first example. Further, this example can further reduce the concentration of the impurity gas relative to that of the hydrogen gas supplied to the chamber 10 as the ionizable gas.

Namely, this example is adapted to prevent the invasion of the impurity gas from the low-pressure gas cylinder 36 into the chamber 10 by means of the permselective means 37. In the same way as described in the first example, this example is also adapted to clean the impurity gas in the walls of the chamber 10 by means of the high-pressure cleaning gas. In this way, this example can reduce the concentration of the impurity gas relative to that of the ionizable gas because both the impurity gas from the gas cylinder 36 and the impurity gas in the walls of the chamber 10 can be removed. As a result, the current of the hydrogen ion beam 27 can be stabilized.

This example employs a small, low-pressure hydrogen gas cylinder as the gas cylinder 36 for supplying the ionizable gas. The GFIS 1A can be downsized by virtue of the size reduction of the gas cylinder 36. Since the ionizable gas is consumed less than the cleaning gas, the size reduction of the gas cylinder 36 entails no operational problem of the GFIS 1A.

Further, this example uses the low-pressure hydrogen gas as the ionizable gas while the cleaning gas contains hydrogen gas in only a mixing ratio less than the explosion limit. Therefore, the explosion-proof device need not be provided. As a result, the total device cost of the GFIS 1A can be reduced.

This example employs the small low-pressure gas cylinder as the gas cylinder 36 for supplying the hydrogen gas as the ionizable gas. Alternatively, a pipe branched from the cleaning gas supply system 60 may be connected to the ionizable gas supply pipe 31 at place upstream of the permselective means 37. In this case, the mixture gas of hydrogen gas and helium gas is purified to pure hydrogen gas by the permselective means 37 before supplied to the emitter electrode 21. In this manner, the running cost of the GFIS 1A can be reduced by sharing a hydrogen source between the cleaning gas supply system 60 and the ionizable gas supply system 30. In this case, however, the thickness of the palladium-copper alloy film of the permselective means 37 need be adjusted. The amount of hydrogen permeating the permselective means 37 is not dependent upon the pressure of the mixture gas but upon the partial pressure of the hydrogen gas.

Example 6

Figure 7:
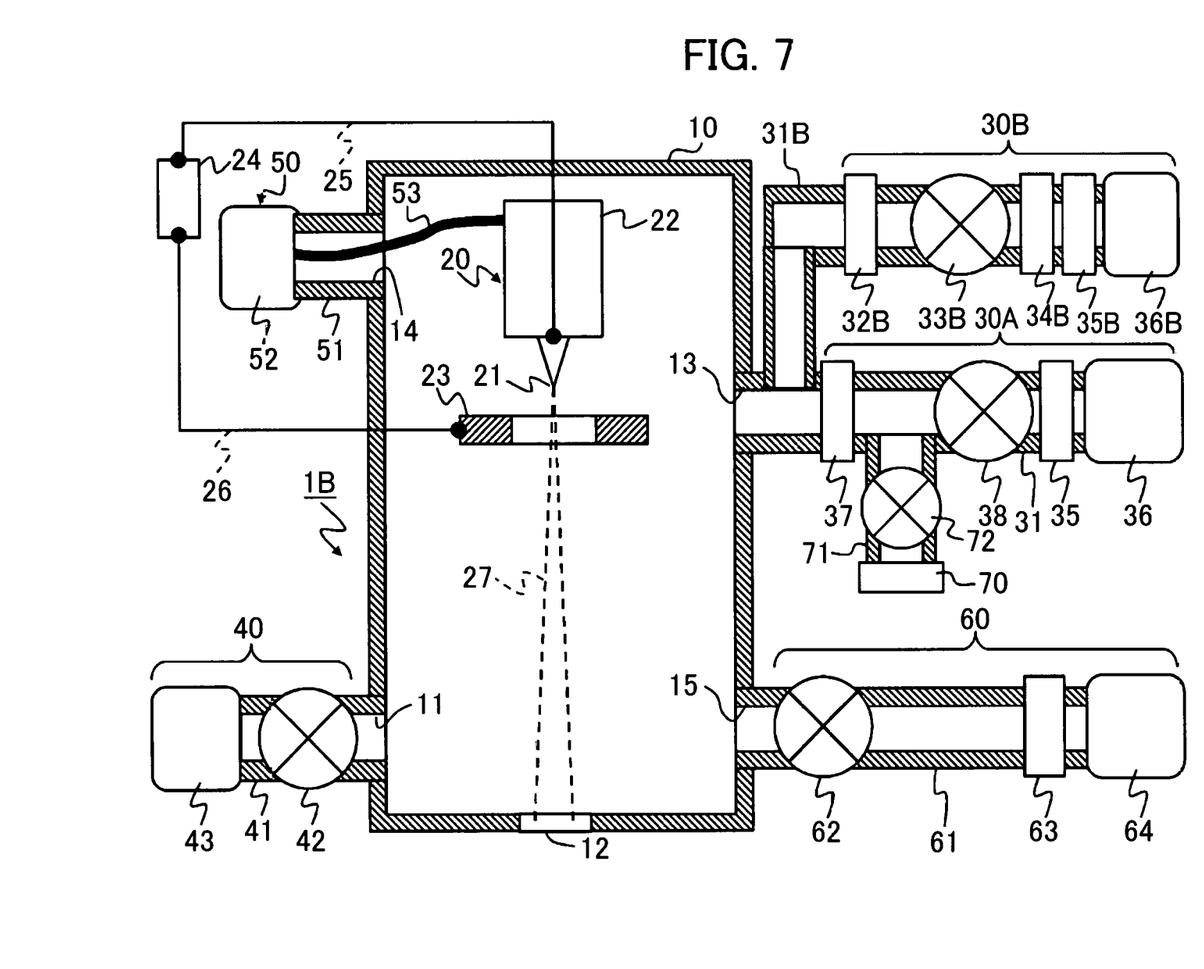
FIG. 7 is a diagram showing the overall structure of a gas field ion source according to a sixth example.

A sixth example is described with reference to FIG. 7. A GFIS 1B of this example has a structure common to that of the GFIS 1A illustrated by the fifth example. The details of the ionizable gas supply system 30A are the same as those of the fifth example. Just as in the fifth example, the ionizable gas is a gas mixture of helium gas and hydrogen gas and the mixing ratio of the hydrogen gas is 4% that is less than the explosion limit. The details of the cleaning gas supply system 60 are also the same as those of the fifth example.

A difference between this example and the fifth example is that this example uses the plural kinds of ionizable gases in a switchable manner. This example switchably uses the hydrogen gas (H2) and the nitrogen gas (N2).

Accordingly, this example includes a first ionizable gas supply system 30A for supplying the hydrogen gas as a first ionizable gas to the chamber 10 and a second ionizable gas supply system 30B for supplying the nitrogen gas as a second ionizable gas to the chamber 10.

The second ionizable gas supply system 30B includes an ionizable gas supply pipe 31B, a flow regulating mechanism 32B, a valve 33B, a gas purifier 34B, a pressure regulator 35B and a gas cylinder 36B, similarly to the components 31 to 36 of the ionizable gas supply system 30 of the first example. It is noted that the gas cylinder 36B is a nitrogen gas cylinder and that the gas purifier 34B is a device allowing the permeation of the nitrogen gas.

A cleaning gas of this example is a mixture gas containing a gas (H2 herein) in a molecular weight equal to or less than that of either of the two types of ionizable gases (H2 and N2). The cleaning gas of this example is a mixture gas containing the gas (e.g., H2) in the molecular weight equal to or less than that of the ionizable gas, and an inert gas (e.g., He). Whether the ionizable gas of hydrogen or the ionizable gas of nitrogen is used, the use of the cleaning gas of such a composition provides a sufficient effect of cleaning the impurity gas with the cleaning gas.

The cleaning with the cleaning gas (operation in the cleaning mode) is normally performed when the chamber 10 is opened to the atmosphere for replacement of the emitter electrode 21. In the case of this example adapted for selective use of the plural kinds of ionizable gases, changes of the ionizable gas may induce the fluctuation of the concentration level of the impurity gas. Therefore, this example takes the following procedure. The number of changes of the ionizable gas is previously counted. When the number of changes of the ionizable gas reaches a predetermined number, the long-time cleaning process with continuous discharge as shown in FIG. 4(*a*) is performed. Subsequently, when the emitter electrode 21 is replaced, the short-time cleaning process as shown in FIG. 4(*b*) is performed once or more than once.

This example also achieves the same working effect as the first example and the fifth example. Further, this example can reduce the impurity gas in the case of using the plural kinds of ionizable gases in the switchable manner. Therefore, this example can stabilize the current of the ion beams 27 of the plural ion species.

Example 7

A seventh example is described with reference to FIG. 8. This example illustrates a case where the GFIS 1 is applied to a scanning ion microscope as the ion beam device.

Figure 6:
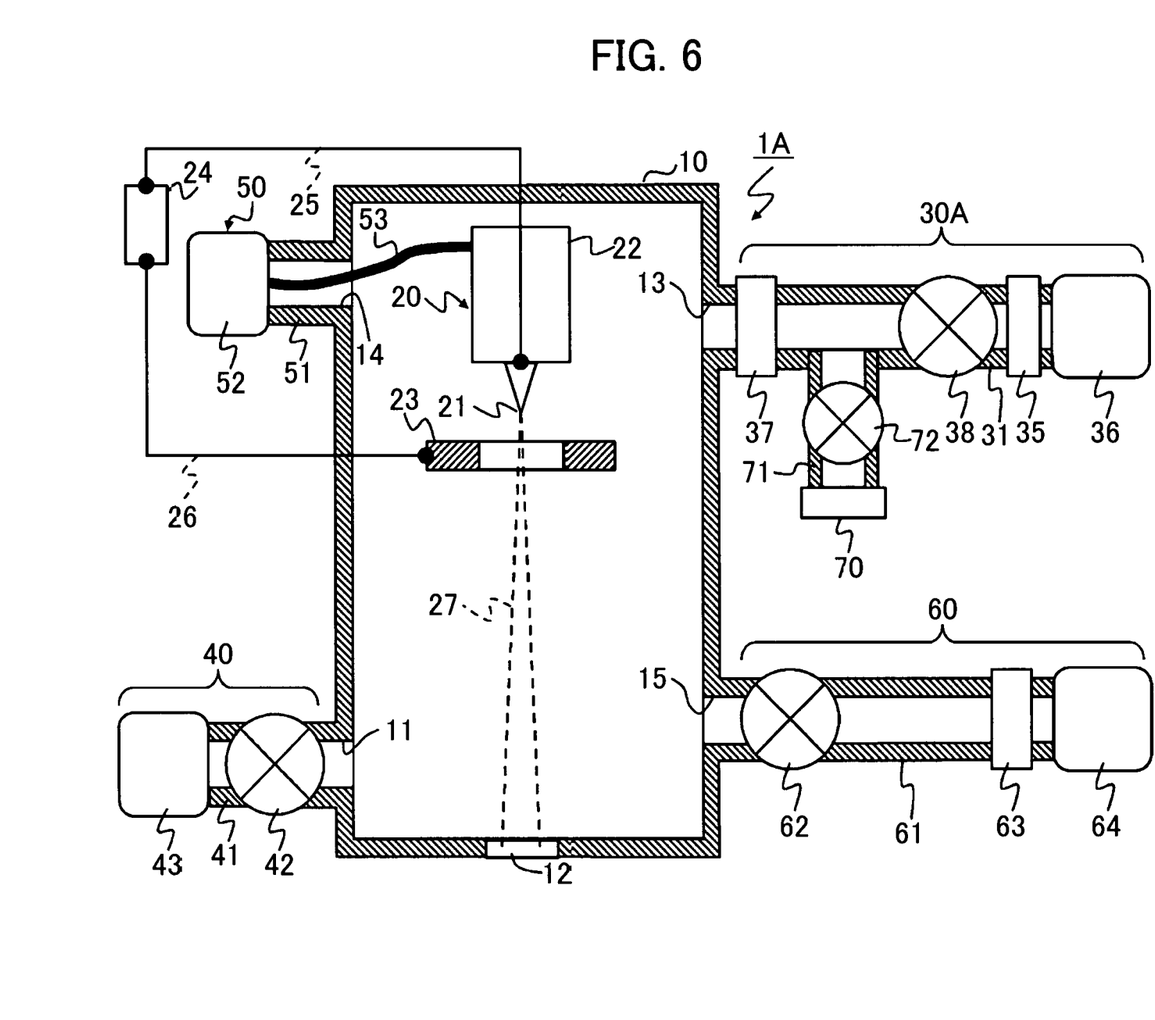
FIG. 6 is a diagram showing the overall structure of a gas field ion source according to a fifth example.

FIG. 6 is a diagram showing the overall structure of a scanning ion microscope 2. The basic structure of the scanning ion microscope 2 is the same as that of a focused ion beam (FIB) system produced for use with gallium liquid metal ion source (Ga-LMIS) having a maximum accelerating voltage of 40 kV. The gas field ion source of the scanning ion microscope 2 is configured as the GFIS 1B illustrated by the sixth example. Since the GFIS 1B has been specifically described with reference to FIG. 7, the structure thereof is not shown in FIG. 8.

The scanning ion microscope 2 allows the observation of a sample 111 on a sample stage 110 by irradiating the sample with the ion beam 27. The scanning ion microscope 2 includes, for example, the GFIS 1B, the ion source control unit 100, the ion optical system 120, a secondary electron detector 130, a lens system control unit 140, a deflection system control unit 150, an image processing unit 160, and a microscope control unit 200.

The GFIS 1B is an ion source outputting two types of ion beams 27. The ion source control unit 100 controls the GFIS 1B following a command from the microscope control unit 200. The ion optical system 120 accelerates or focuses the ion beam. The secondary electron detector 130 detects a secondary electron 112 generated by irradiation of the ion beam 27. The lens system control unit 140 controls electrostatic lenses 121A, 121B and an aperture 121C. The deflection system control unit 150 controls deflecting electrodes 122A, 122B. The image processing unit 160 generates a secondary electron observation image from signals from the secondary electron detector 130. The microscope control unit 200 controls the general operations of the scanning ion microscope 2 in response to an operation by the user.

The scanning ion microscope 2 makes an H2-ion or N2-ion beam 27 emitted from the GFIS 1B incident to the ion optical system 120. The H2-ion beam is used for fine observation while the N2-ion beam is used for microfabrication.

The ion beam 27 accelerated, focused and deflected by the ion optical system 120 is illuminated onto the sample 111 on the sample stage 110. The secondary electrons 112 generated from the sample 111 by the irradiation of the ion beam 27 are detected by the secondary electron detector 130. Incidentally, a vacuum is drawn on a passage area of the ion beam 27.

Of the ion optical system 120, parts responsible for the acceleration, focusing, axis adjustment, and opening angle limitation of the ion beam 27 are controlled by the lens system control unit 140. Of the ion optical system 120, parts responsible for the deflection and scanning of the ion beam 27 on the sample 111 are controlled by the deflection system control unit 150.

The image processing unit 160 generates the secondary electron observation image by establishing correspondence between an intensity signal of the secondary electron 112 received from the secondary electron detector 130 and a scanning signal of the deflection system control unit 150.

The microscope control unit 200 controls not only the general operations of the scanning ion microscope 2 including the ion source control unit 100, the lens system control unit 140, the deflection system control unit 150, and the image processing unit 160 but also inputs from and outputs to other devices and the user. For example, the microscope control unit 200 retrieves the secondary electron observation image from the image processing unit 160 and displays the image on an unillustrated display. The microscope control unit 200 can illuminate the ion beam 27 onto a user-specified position on a screen of the secondary electron observation image by controlling the deflection system control unit 150.

The microscope control unit 200 of this example monitors and stores the operating time of the GFIS 1B, namely the ion emission time. Further, the microscope control unit 200 periodically (e.g., at 1-minute time interval) monitors and stores the current of the ion beam 27. The current of the ion beam 27 can be measured with a Faraday cup placed at a destination of the ion beam deflected by blanking deflection in the ion optical system 120. Further, the microscope control unit 200 has a function to calculate a decrease in the emission stability of ion from the current change of the ion beam 27.

The microscope control unit 200 of this example determines at least one of the length of the operating time of the GFIS 1B and the level of stability decrease of the ion beam current, and cleans the GFIS 1B with the cleaning gas. The microscope control unit 200 disables the ion emission from the emitter electrode 21 before performing the cleaning mode operation. Namely, the microscope control unit 200 disables the cooling of the emitter electrode 21, introduces the cleaning gas into the chamber 10 at high pressure, and discharges the cleaning gas (including the impurity gas) without generating electric discharge.

When the cleaning of the GFIS 1B is completed, the microscope control unit 200 switches the operation to the normal mode to emit the ion beam 27 from the GFIS 1B. Specifically, the microscope control unit 200 starts the cooling of the emitter electrode 21, introduces the ionizable gas into the chamber 10 at low pressure, and applies the electric field to the emitter electrode 21 for emission of the ion beam 27.

Basically, the cleaning mode operation (the mild cleaning process by way of continuous discharge as shown in FIG. 4(*a*), for example) is performed at regular time intervals before the ion beam 27 becomes instable. Otherwise, when the destabilization of the ion beam current is detected, the cleaning of the GFIS 1B (the above-described mild cleaning process by way of continuous discharge) may be performed at that point in time.

It is preferred to program the microscope control unit 200 to perform a routine to notify the user of the cleaning of the GFIS 1B before the cleaning process is started. Further, it is desirable that an automatic operation program using the ion beam 27 previously incorporates an urgent processing routine to deal with the cleaning process. It is also preferred to program the microscope control unit to perform a routine to permit the user to determine the next operation and to give a command accordingly in a case where the GFIS 1B is enabled to resume its operation at completion of the cleaning process.

As illustrated by the first example and the sixth example, this example having such a structure is adapted to clean the GFIS 1B without entailing wear damage to the emitter electrode 21 and to provide the sample observation by way of the stable ion beam. As a result, the GFIS 1B is increased in reliability, even permitting the automation of long hours of work such as processing using the ion microscope 2.

It is noted that the present invention is not limited to the above-described examples. It is to be understood that changes, modifications and equivalents will be apparent to those skilled in the art who have read the foregoing description.

REFERENCE SIGNS LIST

1, 1A, 1B: gas field ion source,
2: scanning ion microscope
10: chamber
20: ion generator
21: emitter electrode
27: ion beam
30, 30A, 30R: ionizable gas supply system
32, 32B: flow regulating mechanism
34, 34B: gas purifier
35, 35B: pressure regulator
36, 36B: gas cylinder
37: permselective means
40: exhaust system
50: cooling system
60: cleaning gas supply system
63: pressure regulator

The invention claimed is:

1. An ion beam device comprising a gas field ion source which includes: an emitter electrode having a needle-shaped tip; an extraction electrode having an opening at a position spaced apart from the tip of the emitter electrode; and a chamber encapsulating the emitter electrode therein,
    wherein the gas field ion source includes:
    an ionizable gas introduction path for introducing an ionizable gas into the chamber in a state where a voltage equal to or more than a beam generating voltage is applied to the emitter electrode; and
    a cleaning gas introduction path for introducing a cleaning gas into the chamber in either a state where a voltage less than the beam generating voltage is applied to the emitter electrode or a state where no voltage is applied to the emitter electrode, and
    wherein a pressure of the chamber with the cleaning gas introduced therein is higher than a pressure of the chamber when the ionizable gas is introduced therein.

2. The ion beam device according to claim 1,
    wherein when the cleaning gas is introduced into the chamber, the temperature of the emitter electrode is raised higher than when the ionizable gas is introduced.

3. The ion beam device according to claim 2, further comprising a cooling device for cooling the emitter electrode,
    wherein the cooling device is activated when the ionizable gas is introduced into the chamber, and
    wherein the cooling device is deactivated when the cleaning gas is introduced into the chamber.

4. The ion beam device according to claim 1,
    wherein electric discharge in the chamber is suppressed in a state where the cleaning gas is introduced in the chamber.

5. The ion beam device according to claim 1,
    wherein the purity of the cleaning gas is lower than the purity of the ionizable gas.

6. The ion beam device according to claim 1,
    wherein the ionizable gas introduction path is provided with a purification part for purifying the ionizable gas.

7. The ion beam device according to claim 6,
    wherein the purification part is a film for selective permeation of the ionizable gas.

8. The ion beam device according to claim 1,
    wherein the molecular weight of the cleaning gas is equal to or less than the molecular weight of the ionizable gas.

9. The ion beam device according to claim 1,
    wherein the cleaning gas is a mixture gas containing a gas having a molecular weight equal to or less than a molecular weight of the ionizable gas.

10. The ion beam device according to claim 1,
    wherein the cleaning gas contains hydrogen.

11. The ion beam device according to claim 1,
    wherein the ionizable gas is hydrogen.

12. The ion beam device according to claim 1,
    wherein two or more types of gases are used as the ionizable gas, and
    wherein the cleaning gas contains a gas having a molecular weight lower than any of the molecular weights of the two or more types of gases.

13. The ion beam device according to claim 1, further comprising a control unit which controls the introduction of the cleaning gas into the chamber in either a case where the length of operating time of the gas field ion source exceeds a predetermined value or a case where the stability of the ion beam emitted from the gas field ion source is decreased to less than a predetermined value.

14. A cleaning method for a gas field ion source which includes: an emitter electrode having a needle-shaped tip; an extraction electrode having an opening at a position spaced apart from the tip of the emitter electrode; and a chamber encapsulating the emitter electrode therein, and which generates an ion beam by introducing an ionizable gas into the chamber in a state where a voltage equal to or higher than a beam generating voltage is applied to the emitter electrode, the method comprising a first step of increasing the pressure of the chamber to level higher than a pressure to introduce the ionizable gas, by introducing the cleaning gas into the chamber either in a state where a voltage less than the beam generating voltage is applied to the emitter electrode or a state where no voltage is applied to the emitter electrode.

15. The cleaning method for gas field ion source according to claim 14, further comprising a second step of discharging the cleaning gas from the chamber, wherein the first step and the second step are repeated or the first step and the second step are concurrently performed.

16. The cleaning method for gas field ion source according to claim 14, wherein the first step is performed in either a case where the length of operating time of the gas field ion source exceeds a predetermined value or a case where the stability of the ion beam is decreased to less than a predetermined value.

\* \* \* \* \*